United States Patent
Zhang (10) Patent No.: US 9,093,267 B2
(45) Date of Patent: Jul. 28, 2015

(54) METHOD OF CONTROLLING SILICON OXIDE FILM THICKNESS

(71) Applicant: Yuanchang Zhang, Columbus, OH (US)

(72) Inventor: Yuanchang Zhang, Columbus, OH (US)

(73) Assignee: NATCORE TECHNOLOGY, INC., Red Bank, NJ (US)

( * ) Notice: Subject to any disclaimer, the term of this patent is extended or adjusted under 35 U.S.C. 154(b) by 0 days.

(21) Appl. No.: 14/211,695

(22) Filed: Mar. 14, 2014

(65) Prior Publication Data

US 2014/0199857 A1    Jul. 17, 2014

Related U.S. Application Data

(62) Division of application No. 13/434,088, filed on Mar. 29, 2012, now Pat. No. 8,716,152.

(60) Provisional application No. 61/468,696, filed on Mar. 29, 2011.

(51) Int. Cl.
H01L 21/31 (2006.01)
H01L 21/469 (2006.01)
H01L 21/02 (2006.01)
C23C 18/06 (2006.01)
C23C 18/12 (2006.01)
H01L 31/0216 (2014.01)
H01L 31/068 (2012.01)
C25D 5/02 (2006.01)
C25D 17/06 (2006.01)

(52) U.S. Cl.
CPC .......... *H01L 21/02282* (2013.01); *C23C 18/06* (2013.01); *C23C 18/125* (2013.01); *C23C 18/1212* (2013.01); *C23C 18/1216* (2013.01); *C23C 18/1245* (2013.01); *C23C 18/1254* (2013.01); *C25D 5/02* (2013.01); *C25D 17/06* (2013.01); *H01L 31/02167* (2013.01); *H01L 31/02168* (2013.01); *H01L 31/068* (2013.01); *Y02E 10/547* (2013.01)

(58) Field of Classification Search
CPC ..................... H01L 21/02282; H01L 27/1262; H01L 27/1266; H01L 21/02107; H01L 2224/0342; H01L 2224/1142; H01L 2224/2742; H01L 2224/77182; H01L 2224/79182; H01L 21/02164
USPC ......... 438/465, 496, 584, 694, 758, 778, 779, 438/780, 781, 782, 786, 878, 791
See application file for complete search history.

(56) References Cited

U.S. PATENT DOCUMENTS

| 6,197,110 B1 | 3/2001 | Lee et al. |
|---|---|---|
| 6,593,221 B1 | 7/2003 | Lindgren |
| 2005/0056541 A1 | 3/2005 | Oikawa et al. |
| 2008/0292875 A1* | 11/2008 | Van De Wall ................. 428/335 |
| 2009/0047421 A1 | 2/2009 | Yeh et al. |

FOREIGN PATENT DOCUMENTS

JP     2000155939    6/2000

OTHER PUBLICATIONS

EP 12 76 3328 Supplementary European Search Report and European Search Opinion dated Aug. 14, 2014.

* cited by examiner

*Primary Examiner* — Thanh Y Tran
(74) *Attorney, Agent, or Firm* — Winstead PC (57) ABSTRACT

A deposition process for coating a substrate with films of varying thickness on a substrate can be achieved. The thickness of the film deposition can be controlled by the separation between the substrate and a curtain. Different separation distances between the substrate and curtain in the same chemical bath will result in different film thicknesses depositing on the substrate.

19 Claims, 5 Drawing Sheets

METHOD OF CONTROLLING SILICON OXIDE FILM THICKNESS

RELATED APPLICATIONS

This application is a divisional application of U.S. patent application Ser. No. 13/434,088 filed on Mar. 29, 2012, which claims the benefit of U.S. Provisional Patent Application No. 61/468,696 to Yuanchang Zhang, filed on Mar. 29, 2011, which are incorporated herein by reference.

FIELD OF THE INVENTION

This invention relates to controlling the thickness of films by wafer separation. More particularly, to controlling the thickness of silicon oxide films.

BACKGROUND OF INVENTION

Crystalline silicon solar cells remain one of the most popular products in the photovoltaic industry. While other low cost alternatives have arisen, the alternatives have thus far provided low efficiency products. Industrial trends have increased demand for thinner wafers. Common industrial silicon solar cells suffer from a high rear surface recombination and a poor internal reflection of the full area Al back surface field (BSF). In 1989, Blackers et al. introduced a passivated emitter and rear cell (PERC) solar cell. Combining low surface recombination with a high internal reflection, PERC enables significantly higher conversion efficiencies compared to the Al-BSF technology.

It would be highly desirable to have a low cost but highly effective film coating process for the industrial fabrication of PERC solar cells. For the rear surface, a thick $SiO_x$ layer (~100 nm) is required to obtain good passivation and internal reflection. For the front surface, either of single layer of $SiN_x$ or $SiOx/SiN_x$ stack (~10 nm thin $SiO_x$ interlayer is inserted between the silicon surface and $SiN_x$ layer) is desired for both passivation and anti-reflectance purpose. Improved silicon surface passivation of $SiO_x/SiN_x$ stacks over a single layer of $SiN_x$ has already been reported by a number of papers.

In addition, the recent progress of black silicon solar cell showed that applying 20 nm thermal $SiO_x$ passivation layer to a black silicon surface (a chemically etched porous Si surface that could drive the surface reflection down to 2~3% across the spectrum of sunlight) could potentially replace the PECVD $SiN_x$ coated Si surface, resulting in low cost crystalline Si solar cell with minimized efficiency loss. The potential integration of the black silicon surface into PERC solar cell fabrication may increase the need for a coating process allowing the simultaneous growth of a thin film of $SiO_x$ on the front surface and a thick film of $SiO_x$ on rear surface in a single deposition step.

However, to coat a thin $SiO_x$ film on front surface and a thick $SiO_x$ film on rear surface of the silicon solar cell respectively in one growth step is difficult for commonly used thermal oxidation system. Alternatively, this is often achieved in two steps of coating process. First, a thin $SiO_x$ film (~10 to 20 nm) is grown on both surfaces with thermal oxidation. Second, a $SiO_x$ thick film (~100 nm) is deposited on the rear surface by the plasma enhanced chemical vapor deposition (PECVD). This two-step growth process increase the cost of production and increases production time significantly. Therefore, a new process that enables $SiO_x$ deposition on front and back surfaces with different thickness in a one growth process would be highly desirable.

SUMMARY OF THE INVENTION

In an illustrative implementation, a process for coating films of different thicknesses on front and rear surface of a substrate respectively in one growth is provided. The thickness of the film deposition can be controlled by the separation between the substrates during the process. By providing different separation distances between the substrates in the same chemical bath, different film thicknesses may result on the front and rear surfaces of the substrates.

In another illustrative implementation, a process for coating different $SiO_x$ thickness on front and rear surface of a silicon wafer respectively in one growth is provided. The thickness of $SiO_x$ deposition can be controlled by the separation distance between silicon wafers. By providing different separation distances between the wafers in the same chemical bath, different $SiO_x$ film thicknesses may result on the front and rear surfaces of the wafers. In some implementations, the distance may vary along the surface of the wafer. In some implementations, a wafer may be place next to a curtain or the like to provide desired separation distance or distances. The process may facilitate solar cell fabrication where a thin $SiO_x$ film on front surface and a thick $SiO_x$ film on rear surface are desired. The process can also be utilized to provide films of varying thickness on a single surface. In addition to silicon solar cell applications, the process could be extended to any device in which a film of different thickness on different sides of a substrate is desired.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Refer now to the drawings wherein depicted elements are not necessarily shown to scale and wherein like or similar elements are designated by the same reference numeral through the several views.

Referring to the drawings in general, it will be understood that the illustrations are for the purpose of describing particular embodiments of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

An improved film deposition system and method discussed herein allows the film thicknesses to be controlled by wafer separation. The improved film deposition systems and methods may utilize liquid phase deposition (LPD), chemical bath deposition, or the like to deposit a film on a substrate. For example, it may be desirable to deposit a dielectric film on a silicon substrate in solar cell applications. In the LPD process, the thickness of the film deposited on the substrate may be controlled by the wafer separation.

In various applications, it may be desirable to provide films of different thicknesses on different surfaces of a substrate. For example, in a solar cell, it may be desirable to have film coatings of different thicknesses on the front surface and rear surface. For the front surface, a thin dielectric layer may be desired for both passivation and anti-reflectance purpose. For the rear surface, a thick dielectric layer is required to obtain good passivation and internal reflection. However, achieving different film thicknesses in a single growth process is extremely difficult. The coating process may be split up into two steps to provide the desired film thicknesses. For example, both surfaces may be coated with a thin $SiO_x$ film using thermal oxidation in a first step. Next, a plasma enhanced chemical vapor deposition (PECVD) process may be utilized to further deposit a thicker $SiO_x$ film on the rear surface in a second step. In contrast, LPD provides a single growth process in which film thickness can be controlled by wafer separation. LPD is a low cost process to deposit a dielectric film, such as $SiO_x$, on silicon at nearly room temperature. Further, LPD does not require the use of a high temperature furnace or large vacuum deposition chamber, as with thermal oxidation and PECVD. LPD of $SiO_x$ has been demonstrated to provide good passivation to both n-type and p-type silicon surface in U.S. Provisional Application 61/442,461, filed on Feb. 14, 2011, to Yuanchang Zhang.

Figure 1:
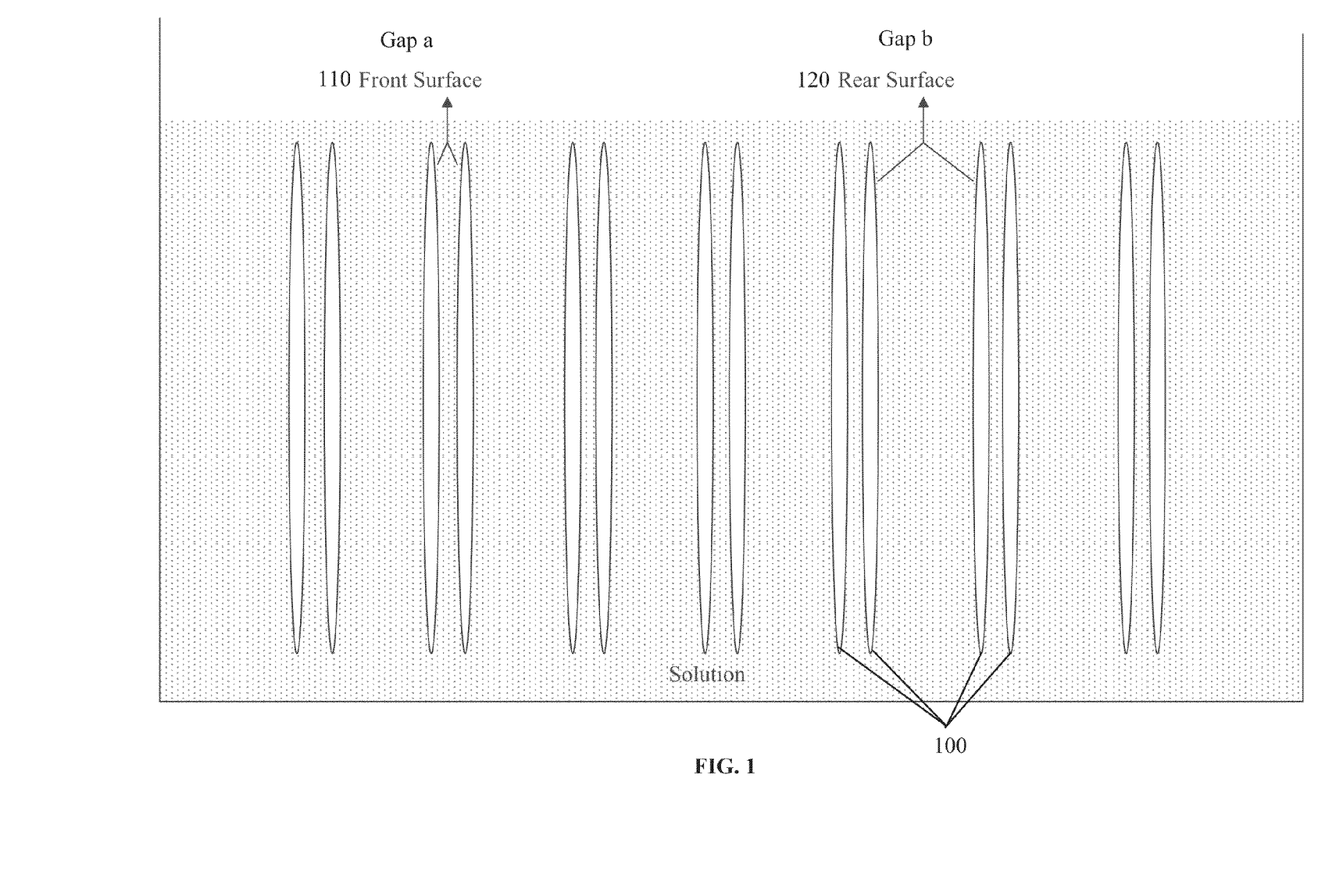
FIG. 1 is an illustrative implementation of an alignment of wafers to achieve different film thicknesses on the front and back surface of wafers.

FIG. 1 is an illustrative implementation of an alignment of substrates 100 to achieve different film thicknesses on the front and back surface 110, 120 of the substrates. This provides an approach to coat the different sides of the substrates 100 with films of different thicknesses in one step of growth. In the growth process to achieve different film thicknesses, all substrates 100 may be aligned with the surfaces facing front 110 to front 110 and rear 120 to rear 120. In addition, the substrates 100 may be separated by different distances between the front surfaces (gap a) and rear surfaces (gap b). The substrates 100 are placed into a chemical solution 130 to allow film growth on the front and rear surfaces 110, 120. Growth is dependent on the growth conditions, such as duration, composition, temperature, chemical nature of the substrate 100 and chemical solution 130, substrate separation, and other factors. Since the substrates 100 are not evenly spaced, custom substrate carriers may be utilized rather than conventional wafer carriers.

Additional Deposition Methods

Figure 2:
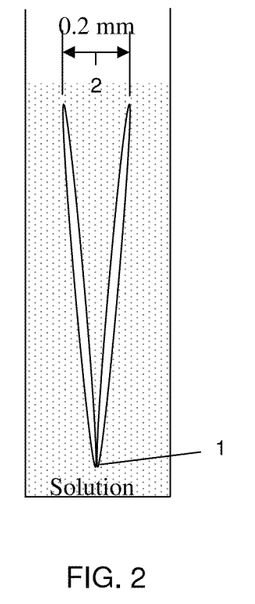
FIG. 2 is an illustrative implementation of a V-shaped wafer arrangement.

Additional deposition methods may utilize variations in variations in wafer separation. In contrast to wafer separations arranging the wafers parallel to each other, other implementations may include different wafer arrangements. FIG. 2 is an illustrative implementation of a V-shaped wafer arrangement utilized during deposition. One end of the wafers are touching each other or nearly touching (gap 1), and the opposite end are separated by a predetermined distance (gap 2) to form a V-shaped space between the two wafer. For example, in the implementation shown, the separation distance between the wafers increase approximately linearly from 0 to 0.2 mm. As a result of the increasing wafer separation distance, the thickness of the film deposited on interior surfaces of the wafers will increase as the wafer separation increases. In other implementations, gap 1 and 2 may be adjusted as desired to achieve a desired thickness profile on the wafers.

The film deposition systems and methods discussed may also be applicable in areas other than PERC, such as multiple colored solar cells. The light receiving surface of a solar cell is preferably as black as possible to get more sunlight absorption. It is possible, however, to produce solar cells in other colors, or even to print images or text on the solar cell so that it serves as a decorative element. For example, color charts indicating a color corresponding to different thicknesses for $SiO_2$ films are known in the art, see Ghandhi, S. K., *VLSI Fabrication Principles*, Table 7.4, 1982.

Figure 3:
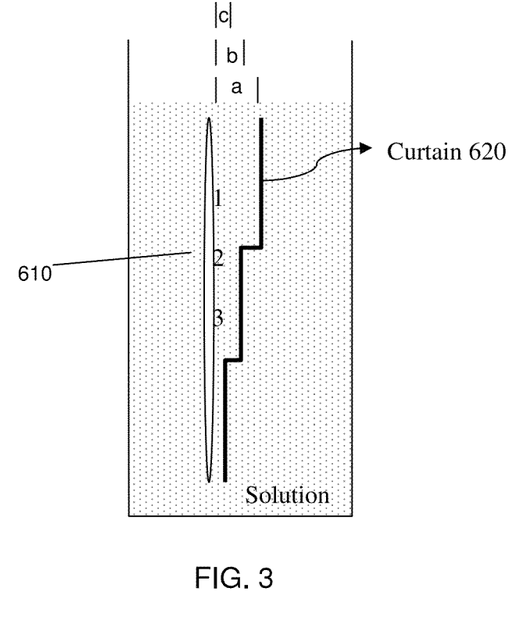
FIG. 3 is an illustrative implementation of a wafer arrangement utilizing a curtain.

FIG. 3 is an illustrative implementation of a wafer arrangement utilizing a curtain. When different film thicknesses are desirable in different regions of a wafer 610, a curtain 620 may be utilized to vary the thickness. A curtain is a member that is place adjacent to a substrate during the deposition process. A curtain may provide patterns, corrugations, cuts, or arrangements that provide different separation distances between the curtain and substrate. As an illustrative example, curtain 620 is corrugated to allow growth of different film thickness in different regions. Region 1 has a separation distance a between wafer 610 and curtain 620, region 2 is separated by a distance b, and region 3 is separated by a distance c. As a result of the different separation distances a, b, and c, different film thicknesses can be provided on wafer 610 in different regions. The different film thickness in the different regions allows wafer 610 to achieve different colors in each region. Therefore, the curtain 620 may be used in the LPD deposition process to make the wafer 610 surface multiple colors in one step of deposition process. In some implementations, the curtain could be made to provide a more sophisticated corrugation, cut, or arrangement in order to get colored patterns, images, or text on the wafer 610 surface. The ability to achieve multiple colored images on solar cell surface in one step of growth using this method is unique compared to other process like CVD, sputtering, atomic layer deposition (ALD), or the like.

In addition to silicon solar cell applications, the wafer separation methods and systems could be extended to any LPD process in need of coating a film of different thickness on different sides of the substrate. The methods discussed are suitable for, but not limited to, LPD $SiO_x$ deposition process. The methods can be adapted to any solution based thin film fabrications where it is desirable to control the film thickness in order to get different film thickness on front and rear surfaces, a thickness gradient across a surface, a patterned film on a surface, different film thicknesses in various regions of a surface, or the like. The methods discussed provide a one step deposition process that is suitable for depositing a variety of different materials. Current solution based thin film fabrication processes could be divided into different types, such as sol-gel deposition process, electrodeposition, hydrothermal reaction, chemical bath deposition (CBD), Successive ion layer adsorption and reaction (SILAR), Electroless deposition (ED) with catalyst, Liquid phase deposition (LPD), or the like. Most of these processes focus on deposition of metal oxides with a formulation as $M_xO_y$ or $L_xM_yO_z$ (where L and M are metal elements, O is oxygen element), metal sulfides with a formulation as $M_xS_y$ (M is metal elements, S is sulfur element), and metal selenides with a formulation $M_xSe_y$ (M is metal elements, Se is selenium element). Solution based thin film fabrications have been widely used due to its flexibility of depositing a broad spectrum of materials. For example, electrodeposition allows deposition of pure metals, alloys, semiconductors, ceramics, and polymers on a variety of substrates. Similarly, the abovementioned deposition methods may be utilized with a broad spectrum of materials to control a film thickness deposited on a substrate. Materials that may be utilized include, but are not limited to, $TiO_2$, $ZrO_2$, $In_2O_3$, $SnO_2$, $BaTiO_3$, ZnS, $Bi_2Se_3$, and/or the like. For example, $TiO_2$ and $ZrO_2$ are alternative materials for silicon solar cell anti-reflection coating. $In_2O_3$ and $SnO_2$ are essential materials to make indium tin oxide (ITO), one of the most widely used transparent conducting oxides in solar cell fabrication.

For example, various suitable methods and solutions for thin film fabrications are known in the art (See Masuda, Yoshitake "Patterning of $TiO_2$ Thin Films and Particles using Self-assembled Monolayers," Doctoral Dessertation, Nagoya University, Japan, 2003). Any of the methods discussed herein for controlling film thickness may be utilized with known LPD processes.

LPD process used here could be performed at ambient temperature or above the ambient temperature. The growth rate typically increases with the reaction temperature. However, larger particles or serious precipitation may occurs earlier using higher temperature that makes the solution blur and unsuitable for the film quality. For typically used concentration H2SiF6:H2O=1:2, the deposition time for 100 nm $SiO_x$ will take a minimum time of 1.5 hour at 45° C. and up to 7 hours at 18° C.

For the purposes of illustration, the growth process is discussed in relation to silicon solar cell applications. However, it will be recognized by one of ordinary skill in the art that the growth process could be applied to any LPD process of coating a film of different thickness on different sides of a substrate including, but not limited to, coating nanostructures on a substrate, photovoltaics, semiconductors, lens coatings, and the like.

The following experimental examples are provided for illustrative purposes only. The various aspects described in the examples merely represent exemplary implementations. It will be recognized by one of ordinary skill in the art that various changes can be made in the implementations described without departing from the spirit and scope of the present disclosure. In silicon solar cell applications, it may be desirable to provide $SiO_x$ films on the front and back surfaces of a silicon wafer. For illustrative purposes, an experimental example of an LPD $SiO_x$ process is discussed herein for coating the front surface with thin $SiO_x$ film while simultaneously coating the rear surface with a thick $SiO_x$ film in one step of growth.

Experimental Results

The reagent solution for the LPD growth of $SiO_x$ was prepared by saturating a ratio of 1 liter of 3 M hexafluorosilicic acid ($H_2SiF_6$) with 60 g 0.007 μm fumed silica powder at room temperature. After overnight saturation, the solution was filtered, first with a course VWR Grade 315 fluted filter for 25 μm particle retention, then with the Millipore Stericap system using 0.22 μm filters. The solution was then diluted to 1 M by adding 18 MOhm DI water.

Figure 4:
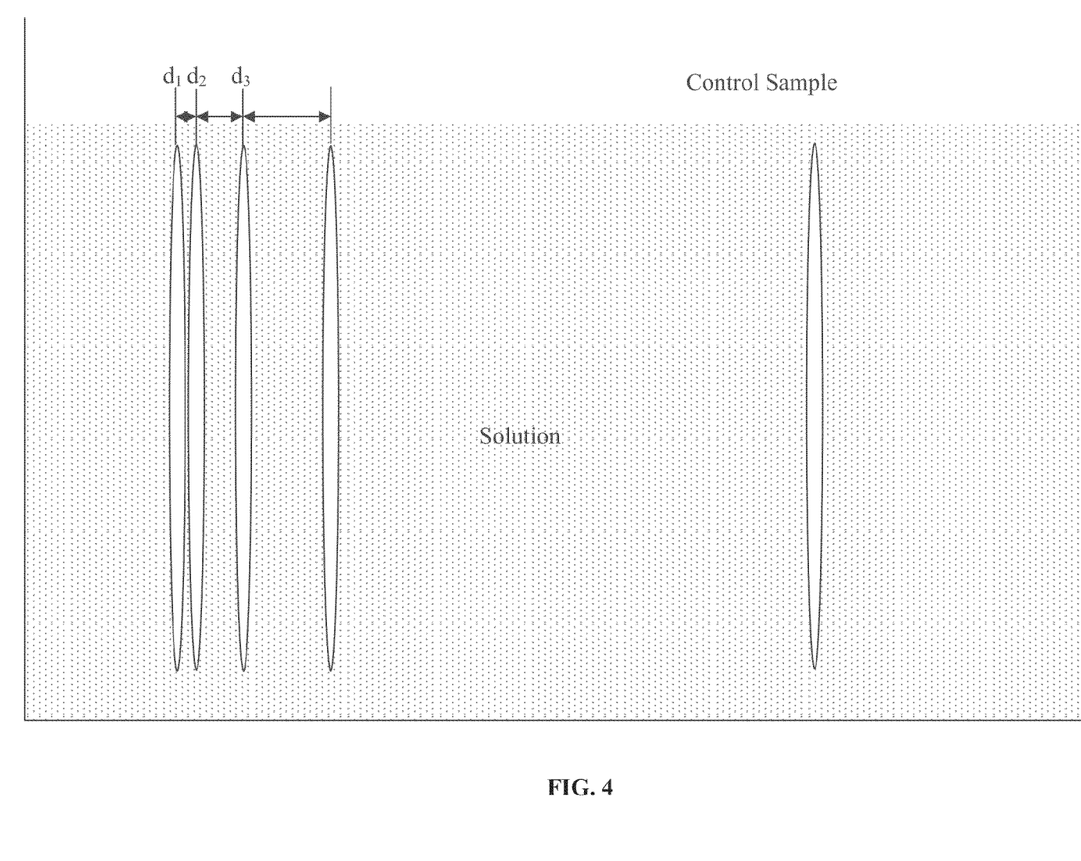
FIG. 4 is an illustrative implementation of an alignment of wafers separated by different gaps.

The addition of water initiated the reaction and precipitated the silica according to:

525 μm 4" single side polished silicon wafers were used. The wafers cleaned by standard procedures were immersed in the solution at a temperature of 18° C. The wafers were aligned vertically and the separations between the adjacent wafers were set to $d_1$=0.2, $d_2$=0.5, and $d_3$=1.0 mm respectively, as shown in FIG. 4. For comparison, control samples were also made with individual wafers far from other wafers during the $SiO_x$ deposition process so that there is enough volume of solution around this wafer. The wafers were pulled out after 5 hr of immersion in the solution followed by rinsing with DI water and drying with $N_2$. The thickness of $SiO_x$ film on the polished surface of each wafer was measured by a thin film analyzer Nanometrics 3000PHX. The refractive index of the as-deposited film was determined by an ellipsometer to be about 1.43 which is slightly lower than that of thermal oxide (n~1.46).

Figure 5:
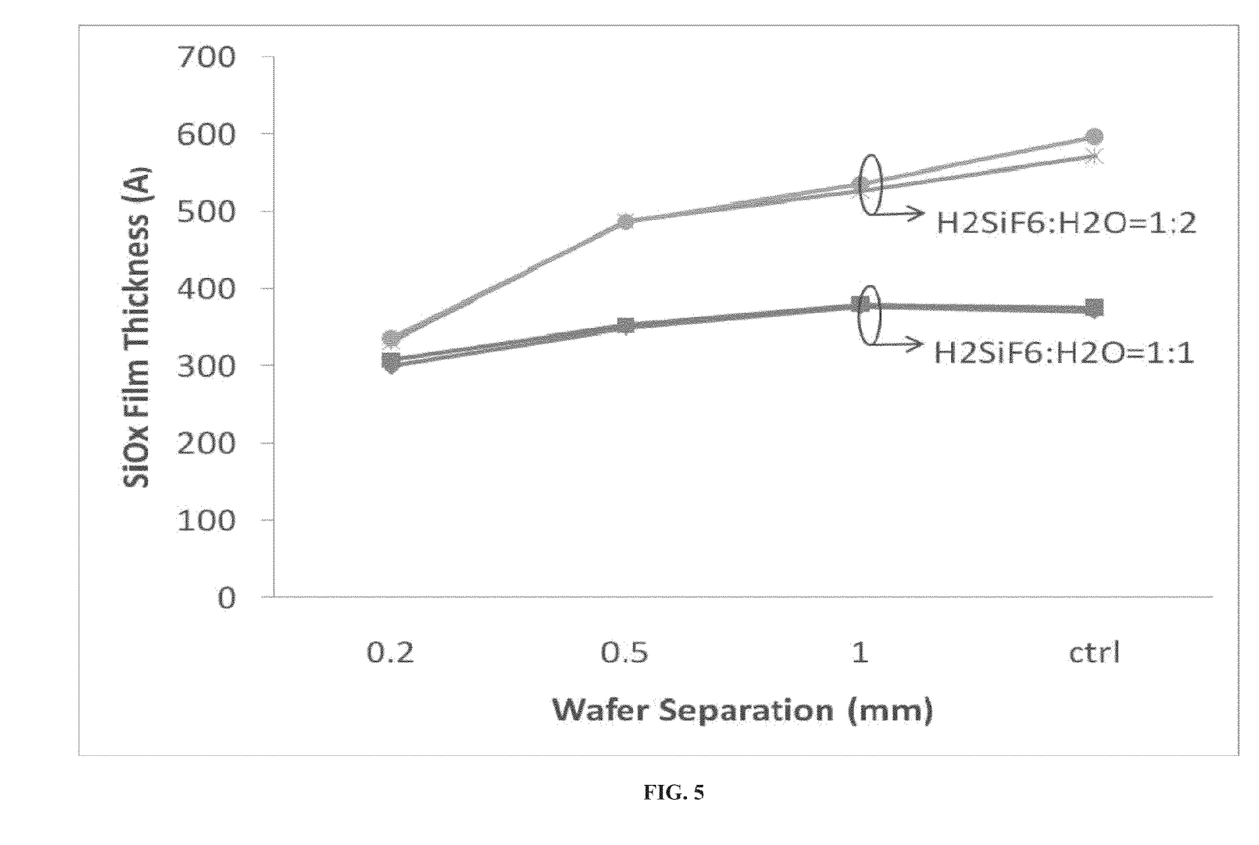
FIG. 5 is a chart of $SiO_x$ film thicknesses versus wafer separation.

FIG. 5 provides a chart illustrating LPD $SiO_x$ film thicknesses versus wafer separation. Two wafer samples were used in solutions with standard and doubled concentrations respectively for comparison. The $SiO_x$ deposition on each wafer in solution of standard concentration shows strong dependence on the separation between the wafers. The sample with 0.2 mm separation has about ⅔ the thickness of the sample with 0.5 mm separation, and almost ½ the thickness of the control sample. This phenomenon appears to be attributed to the solution depletion during the growth. Apparently, compared to the wafers separated with large gap, the solution between wafers with small gap will deplete more rapidly due to the small volume of solution defined in between the wafers. Therefore, the growth rate may reduce significantly with time. In contrast, the growth in solution of doubled concentration shows only slight dependence on the wafer separation. The reason appears to be that the solution depletes much slower due to the doubled concentration, thus not retarding the growth rate in an obvious way.

According to the above experimental results, the $SiO_x$ film thickness is determined by the gap between the wafer surfaces. This provides an approach to coat the different sides of wafers with $SiO_x$ films of different thicknesses in one step of growth. In this growth process to achieve different film thicknesses, all the wafers may be aligned with the surfaces facing front to front and rear to rear. In addition, the wafers may be separated by different gaps for the front surfaces (gap a) and rear surfaces (gap b). With using solution of standard concentration ($H_2SiF_6$:$H_2O$=1:2), the $SiO_x$ film deposited on the front surface will consequently have different thickness compared to that deposited on the rear surface, and the thickness ratio can be adjusted as requested with varying the ratio of gap a to gap b.

FIG. 5 shows that the film thickness has little dependence on a wafer separation larger than 0.5 mm, to attain a big difference of the film thickness for different sides of a wafer, gap b could be set close to 0.5 mm with gap a set to a much smaller number (e.g. less than 0.1 mm). Moreover, the small spacing of the wafers may lead to several times higher loading density compared to conventional wafer carriers where a much larger wafer spacing of around 4~5 mm is adopted. Therefore, the LPD coating process may not only enable coating a wafer with different film thickness on different sides respectively in one step of deposition, but also reduce the solution consumption by several times.

Figure 6:
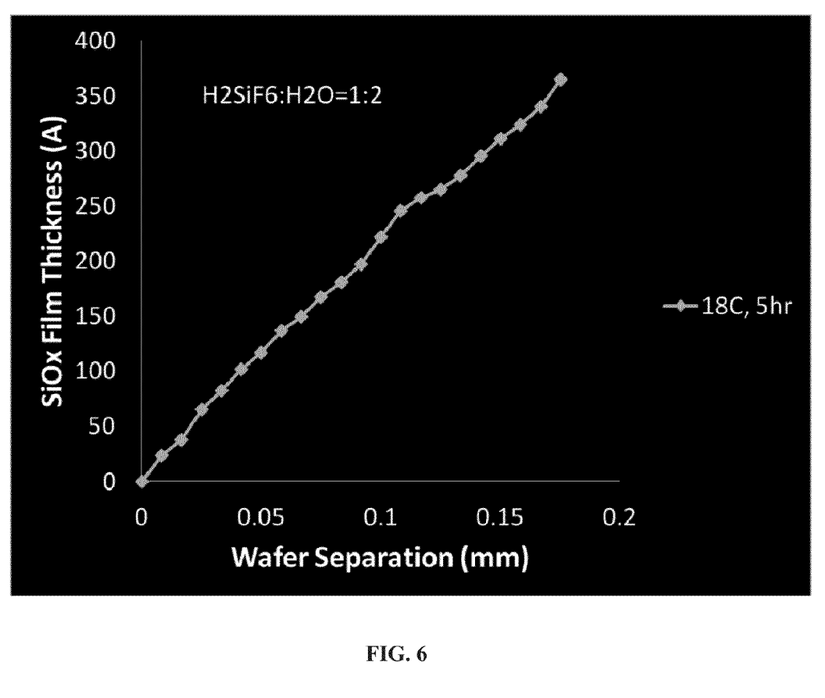
FIG. 6 is a chart of $SiO_x$ film thicknesses versus wafer separation with a V-shaped wafer arrangement.

FIG. 6 is a chart of $SiO_x$ film thicknesses versus wafer separation with a V-shaped wafer arrangement as shown in FIG. 2. After grown in a solution ($H_2SiF_6$:$H_2O$=1:2) at 18° C. for 5 hours, the $SiO_x$ film across the wafer was measured. The film thickness deposition data is plotted vs. the wafer separation at each corresponding point of measurements. It can be seen that the $SiO_x$ film thickness increases approximately linearly with the wafer separation in the range of 0~0.2 mm. The results confirm the ability to attain very thin nanoscale films with small separation distances. For example, a 5 nm thickness with a 0.02~0.03 mm separation between the wafers was achieved. In some implementations, the film deposition methods discussed may allow the $SiO_x$ coating on the front surface to have a thickness of about 1/10 the thickness the rear surface. For example, such a thickness differential could be achieved by providing wafer separation of 0.02~0.03 mm between front surfaces and at least 0.5 mm rear surfaces, and similar deposition settings ($H_2SiF_6$:$H_2O$=1:2, 18° C., 5 hr) as the previously discussed results. Since the film thickness on the rear surface does not change significantly with a separation varied between 0.5 mm and 5 mm, the achieved thickness ratio of front surface to rear surface is mainly dependent on the front surface separation.

The methods can be adapted to any solution based thin film fabrications where it is desirable to control the film thickness in order to get different film thickness on front and rear surfaces, a thickness gradient across a surface, a patterned film on a surface, different film thicknesses in various regions of a surface, or the like. The methods discussed provide a one step deposition process that is suitable for depositing a variety of different materials. For example, the process may be utilized to deposit of metal oxides with a formulation as $M_xO_y$ or $L_xM_yO_z$ (where L and M are metal elements, O is oxygen element), metal sulfides with a formulation as $M_xS_y$ (M is metal elements, S is sulfur element), and metal selenides with a formulation $M_xSe_y$ (M is metal elements, Se is selenium element). Further materials that may be utilized include, but are not limited to, $TiO_2$, $ZrO_2$, $In_2O_3$, $SnO_2$, $BaTiO_3$, ZnS, $Bi_2Se_3$, and/or the like.

Unlike the thermal oxidation, LPD deposited silicon oxide is a low temperature process to achieve dielectric thin film on Si substrate, potentially reducing the energy consumption and the wafer thickness used in the fabrication of crystalline Si solar cells. Additionally, the LPD process discussed provides a novel method of controlling the film thickness of the LPD deposited silicon oxide. Compared to the multiple steps of process usually taken for coating different surfaces of the cell with different thicknesses, the LPD process allows for one step growth to accomplish the goal, which features a simple and low-cost method. Further, by controlling the separation distances between the wafers, the LPD process creates a way of minimizing the chemical solution consumption providing a significant cost reduction.

While the abovementioned wafer separation methods and systems discuss may discuss specific temperatures, concentrations, and deposition periods, the wafer separation methods and systems discussed can be performed at different temperatures, different solution concentrations, different deposition periods, and/or the like. It will be recognized by one of ordinary skill in the art that temperatures, concentration, deposition periods, and/or the like can be modified as desired.

The process deposits a thin film to a group of specially aligned wafers in a chemical bath. The process may includes the steps of the operation, such as solution preparation, wafer loading to wafer carrier, immersing the wafers in the solution for a certain period of time, or the like. One of ordinary skill in the art will recognize that the type of wafers, gap between wafers, type of solution, solution concentration, and/or any other parameters in the process may be varied as desired.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method for coating a solar cell substrate with a film, the method comprising:
   preparing a chemical solution for deposition of a film with varying thickness on a solar cell substrate;
   placing the solar cell substrate into the chemical solution next to a curtain that is separate and distinct from the chemical solution for a predetermined period of time to deposit the film on the solar cell substrate, wherein the curtain is shaped to vary a separation distance between the curtain and the solar cell substrate, the curtain is shaped to provide at least a first region separating the curtain from the solar cell substrate by a first distance and a second region separating the curtain from the solar cell substrate by a second distance different from the first distance, and a thickness of the film deposited on the solar cell substrate varies with a separation distance between the solar cell substrate and the curtain; and
   removing the solar cell substrate from the chemical solution, wherein the thickness of the film increases with the separation distance.

2. The method of claim 1, wherein the curtain is shaped to cause the film deposited on the solar cell substrate to form an image, text, or pattern.

3. The method of claim 1, wherein the curtain is shaped to cause different colored films to form on the solar cell substrate.

4. The method of claim 1, wherein the film deposited on the solar cell substrate is a silicon oxide ($SiO_x$) film.

5. The method of claim 4, wherein the chemical solution comprises hexafluorosilicic acid ($H_2SiF_6$).

6. The method of claim 1, wherein the film deposited on the solar cell substrate is a metal oxide, metal sulfide, or metal selenide.

7. The method of claim 6, wherein the film deposited on the solar cell substrate is $M_xO_y$ or $L_xM_yO_z$, where L and M are metal elements and O is an oxygen element; $M_xS_y$, where M is metal element and S is a sulfur element; or $M_xSe_y$, where M is metal element and Se is selenium element.

8. The method of claim 1, wherein the film deposited on the solar cell substrate is $TiO_2$, $ZrO_2$, $In_2O_3$, $SnO_2$, $BaTiO_3$, ZnS, $Bi_2Se_3$, or indium tin oxide (ITO).

9. The method of claim 1, wherein the first distance is greater than the second distance, and a first thickness of the film adjacent to the first region of the curtain is greater than a second thickness of the film adjacent to the second region of the curtain.

10. A method for coating a solar cell substrate with a film, the method comprising:
    mixing a chemical solution for depositing a film of varying thickness on a solar cell substrate;
    positioning the solar cell substrate adjacent to a curtain in the chemical solution for a predetermined of time, wherein the curtain is separate and distinct from the chemical solution, and the curtain comprises a first region separating the curtain from the solar cell substrate by a first distance, and a second region separating the curtain from the solar cell substrate by a second distance different from the first distance; and removing the solar cell substrate from the chemical solution, wherein a first thickness of the film deposited corresponds to the first region of the curtain, and a second thickness of the film deposited corresponds to the second region of the curtain.

11. The method of claim 10, wherein the chemical solution comprises hexafluorosilicic acid ($H_2SiF_6$) and silica powder.

12. The method of claim 10, wherein the ratio of hexaflourosilicic acid is 1:1 or 1:2.

13. The method of claim 10, wherein the curtain is shaped to cause the film deposited on the solar cell substrate to form an image, text, or pattern.

14. The method of claim 10, wherein the curtain is shaped to cause different colored films to form on the solar cell substrate.

15. The method of claim 10, wherein the film deposited on the solar cell substrate is a silicon oxide ($SiO_x$) film.

16. The method of claim 10, wherein the film deposited on the solar cell substrate is a metal oxide, metal sulfide, or metal selenide.

17. The method of claim 16, wherein the film deposited on the solar cell substrate is $M_xO_y$ or $L_xM_yO_z$, where L and M are metal elements and O is an oxygen element; $M_xS_y$, where M is metal element and S is a sulfur element; or $M_xSe_y$, where M is metal element and Se is selenium element.

18. The method of claim 10, wherein the first distance is greater than the second distance, and the first thickness is greater than the second thickness of the film.

19. The method of claim 10, wherein the film deposited on the substrate is $TiO_2$, $ZrO_2$, $In_2O_3$, $SnO_2$, $BaTiO_3$, ZnS, $Bi_2Se_3$, or indium tin oxide (ITO).

* * * * *